United States Patent [19]

French

[11] Patent Number: 4,547,709

[45] Date of Patent: Oct. 15, 1985

[54] CATHODE RAY TUBE DISPLAY DEVICE

[75] Inventor: Jack G. French, Lowestoft, England

[73] Assignee: Mars, Incorporated, McLean, Va.

[21] Appl. No.: 335,365

[22] Filed: Dec. 29, 1981

[30] Foreign Application Priority Data

Dec. 31, 1980 [GB] United Kingdom ............... 8041526

[51] Int. Cl.$^4$ ............................................. H01J 29/78
[52] U.S. Cl. ................................... 315/378; 335/213
[58] Field of Search ....................... 315/378, 399, 398; 335/213; 313/440, 426, 427; 358/180, 60

[56] References Cited

U.S. PATENT DOCUMENTS

| | | | |
|---|---|---|---|
| 2,414,939 | 1/1947 | Fitch | 315/398 |
| 2,544,355 | 3/1951 | Richmond | 315/378 |
| 2,799,798 | 7/1957 | Kratz et al. | 313/440 |
| 2,821,657 | 1/1958 | Newhouse | 313/440 |
| 3,173,053 | 3/1965 | Mead | 315/378 |
| 3,934,173 | 1/1976 | Korver | 315/399 |

FOREIGN PATENT DOCUMENTS

| | | | |
|---|---|---|---|
| 2801310 | 7/1978 | Fed. Rep. of Germany | 358/180 |
| 610910 | 10/1948 | United Kingdom | 358/180 |

*Primary Examiner*—Theodore M. Blum

[57] ABSTRACT

A cathode ray tube display device having beam deflection coils (8,10,12,14) and means (44 and 46) for applying to inductive means (58 plus the coils) which includes the beam deflection coils a voltage for causing a ramp current to flow in the coils to produce progressive beam deflection, comprising means (52,54,56) for selectively modifying interconnections between the coils to change the inductance presented to the voltage applying means and thus change the gradient of the ramp current and the rate of beam deflection, said interconnection modifying means being operable to change the number of deflection coils through which said current flows.

12 Claims, 3 Drawing Figures

CATHODE RAY TUBE DISPLAY DEVICE

FIELD OF THE INVENTION

This invention relates to a cathode ray tube display device, and in particular to such a display device in which the rate of deflection of the CRT beam, and consequently of the display spot across the face of the tube, can be set to different values.

BACKGROUND OF THE INVENTION

Such devices are used for example to provide displays in radar equipment. At the instant each radar pulse is transmitted, the CRT team begins to be deflected away from the centre of the tube face radially towards its periphery. The received echo pulse is arranged to amplify the beam so that a bright spot appears on the tube face, at a radial distance from its centre proportionate to the distance of the object which caused the echo. The deflection coils which deflect the CRT beam are continually rotated about the axis of the CRT by means of suitable and well known arrangements, in synchronism with rotation of the scanner from which the radar pulse is transmitted, and at which the reflected echo is received. Consequently, each successive beam scan is in a slightly different radial position, progressively incrementing round the tube face, with the result that a complete display of the radar-reflecting features located in all directions around the scanner is provided.

It is normally required, particularly in radar equipment used on boats, to be able to set the equipment for different ranges. That is to say, such that the picture on the tube face represents on a relatively large scale the radar-reflecting features present within a relatively short distance of the scanner, or represents on a smaller scale the features present within a greater distance of the scanner. This is achieved by radially deflecting the beam at different speeds for different ranges. The faster the deflection, the sooner the beam will arrive at the periphery of the tube face, and consequently the closer to the scanner will be any object which produces an image at the periphery of the tube face. Conversely, if the beam is deflected more slowly, that same object would produce its image closer to the tube centre, and a more distant object would produce an image at the tube periphery. Thus, for each range required, a corresponding beam deflection speed must be employed, the highest speed corresponding to shortest range and the lowest speed corresponding to the longest range.

In the prior art, in order to achieve this, a range inductor which has tappings at various points along its length is coupled to the deflection coils. A range selecting switch is operable so as to connect successively longer sections of the range inductor in series with the deflection coils, so that the total inductance of the active portion of range inductor and the deflection coils themselves successively increases as the range selecting switch is moved through its positions. To initiate each beam deflection, a scan coil driver circuit applies a constant voltage to this combined inductance and this results in a linear rise in the current flowing through the deflection coils and consequently a linear deflection of the CRT beam. The rate at which this ramp current rises is determined by the value of the total inductance, such that the beam deflection is fastest when the inductance is lowest i.e. when the smallest section, or none, of the range inductor is connected to the coils, and is slowest when the total inductance is greatest i.e. when the whole of the range inductor is connected to the coils.

Since the inductance of the coils is fixed, the whole range of inductance adjustment has to be accommodated by the range inductor. It must therefore be quite large and consequently relatively expensive and also, when operating at the longest ranges, a relatively large proportion of the total active inductance will be in the range inductor and a relatively lower proportion in the deflection coils themselves, so that a significant amount of power is wasted through being dissipated in the range inductor. This is significant, particularly in radar equipment intended for small boats, because in this situation the power generation and storage facilities available are small. The power consumption of radar equipment presently available makes it unsuitable for many small boats, and reduction of the power consumption of such equipment assists in making it practical for installation on small boats with limited power generation and storage facilities as, of course, do factors which reduce the cost of the radar equipment itself.

SUMMARY OF THE INVENTION

The present invention provides a cathode ray tube display device having beam deflection coils and means for applying to inductive means which includes the beam deflection coils a voltage for causing a pump current to flow in the coils to produce progressive beam deflection, comprising means for selectively modifying the interconnections between the coils to change the inductance presented to the voltage applying means and thus change the gradient of the ramp current and the rate of beam deflection, said interconnection modifying means being operable to change the number of deflection coils through which said current flows.

A power saving is achieved by connecting extra deflection coils in series as the range setting is increased, because this increases the total number of deflection coil turns and enables a lower deflection current to be employed in order to achieve a given deflection field and hence rate of beam deflection.

It will become evident that the selective modification of the interconnections between the deflection coils may further involve connecting coils in parallel with each other to provide reduced inductance, and in series with each other to increase the inductance.

Additionally, the total inductance may include one or more inductance values which is or are selectively connectable to the beam deflection coils, to further change the inductance presented to the voltage applying means. Progressively larger inductance values may be connected to the deflection coils step-by-step as the interconnections of the latter are step-by-step modified, so as to provide the various total inductance values required, as will become apparent.

However, the manner in which the effective inductance of the deflection coils can be progressively increased by modifying their interconnections means that at the higher ranges more of the total inductance can be present in the deflection coils themselves, and less in the range inductor, so that waste of power in the latter is reduced.

Also, since the range inductor does not have to accommodate the full range of adjustment required, it can be smaller and therefore less costly.

Linearity of the scan is also inherently improved as will be explained in more detail.

BRIEF DESCRIPTION OF THE DRAWINGS

In order that the invention may be more clearly understood, a preferred embodiment thereof will now be described, by way of example, with reference to the accompanying diagrammatic drawings, in which.

DETAILED DESCRIPTION OF AN EMBODIMENT

Figure 1:
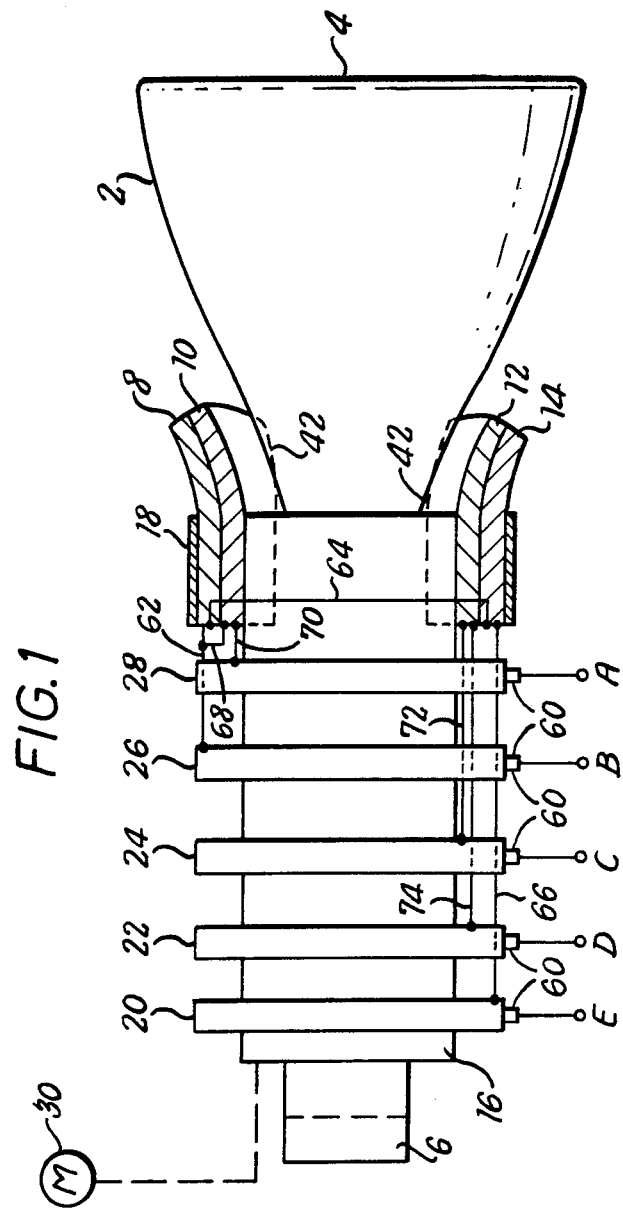
FIG. 1 shows a cathode ray tube display device equipped with rotatable and switchable deflection coils.

In FIG. 1, a cathode ray tube is indicated at 2, having a faceplate 4 on which its beam forms a display in usual manner, and with means 6 for forming, focussing and modulating the beam indicated very schematically, since the latter do not form part of the present invention.

Two beam deflection coils indicated at 8 and 10 are superimposed on each other and located one side of the neck of the tube 2. Two similar deflection coils 12 and 14 are superimposed on each other and located on the opposite side of the neck of the tube. The two pairs of deflection coils are mounted on a rotatable sleeve 16, being secured thereto by a heat-shrunk sleeve 18 of suitable plastics material. The rotatable sleeve 16 is of electrically insulating material and carries five slip rings 20, 22, 24, 26, and 28. Sleeve 16, the deflection coils and the slip rings form a unit which is rotated in generally known manner by means of motor 30.

Figure 3:
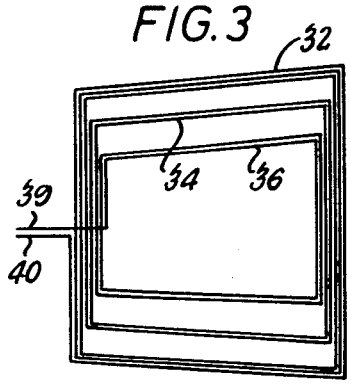
FIG. 3 shows an individual one of the four deflection coils employed in the device of FIG. 1.

FIG. 3 shows an individual one of the deflection coils 8, 10, 12, and 14. The coil is initially flat and comprises three outer turns 32, two intermediate turns 34 and two inner turns 36, the free ends of the coil turns being indicated at 39 and 40. Each coil is then deformed to a curved shape, arcuate about the axis of the CRT 2 as indicated in broken lines at 42 in FIG. 1, and is also given a flared form at its wider end so as to approximately match the flared shape of the neck of the CRT 2, as also can be seen in FIG. 1.

Figure 2:
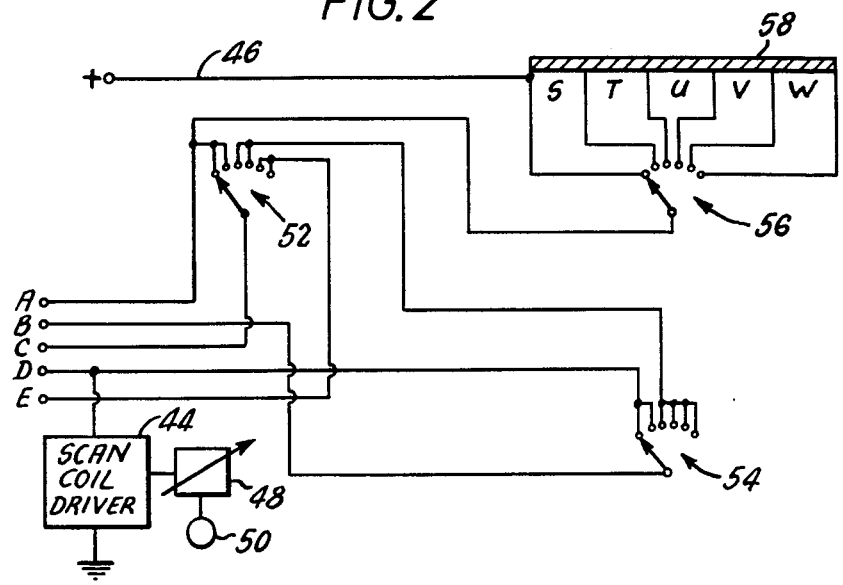
FIG. 2 shows circuitry associated with the device of FIG. 1 and connected thereto by means of terminals A, B, C, D, E.

The voltage for scanning the CRT beam from the centre of the tube towards its periphery is for example +10 V and is provided on line 46 shown in FIG. 2. To initiate a scan, a scan coil driver circuit 44, which is a transistor switching circuit, is rendered conductive in any suitable and known manner. Since the beam scan is intended to be longer for longer ranges, and shorter for shorter ranges, the length of time for which circuit 44 conducts is varied accordingly, and this is achieved by means of a control circuit 48, which again may be of generally known kind, which is selectively settable to cause the scan coil driver 44 to switch on for different predetermined periods of time, the control circuit 48 normally being set by means of a manual control referred to as a range switch, and illustrated at 50.

Ganged with the control circuit 48 and also operable by means of range switch 50 are multi-position switches 52, 54 and 56 which each have six positions as shown. Scan coil driver circuit 44 has six corresponding different "on" periods.

The particular embodiment being described is capable of being set to six different ranges, namely 0.5, 1.0, 2.0, 4.0, 8.0 and 16.0 miles, these being the distances which are represented by a display feature at the periphery of tube face 4 when the equipment is set to each of the different ranges. The switches 52, 54 and 56 are illustrated in the 0.5 mile range position and they are switched through the ranges progressively up to 16 miles by being moved towards the right as viewed in FIG. 2. Operation of the range switch 50 in order to do this, simultaneously lengthens the "on" period of scan coil driver 44.

A range inductor is shown at 58 which is tapped at its ends and at four intermediate points to provide five range inductor sections indicated at STUVW. In a practical construction, the inductances of these sections (in $\mu H$) are such that $S=2.5$, $S+T=13$, $S+T+U=32$, $S+T+U+V=170$ and $S+T+U+V+W=390$. The inductances of the scan coils 8, 10, 12 and 14 are 5.5 $\mu H$ each.

In FIG. 1 it is to be noted that the connections A, B, C, D and E from FIG. 2 go to respective ones of brushes 60 which contact respective ones of the slip rings 20 to 28. The terminal portions of each of the coils 8, 10, 12 and 14 are connected to each other or to the respective slip rings as follows. Coils 8 and 14 are connected in series between slip rings 26 and 20 by means of conductors 62, 64 and 66. Coil 10 is connected between slip rings 26 and 28 by means of a conductor 68 leading to conductor 62, and a conductor 70. Coil 12 is connected between slip rings 22 and 24 by means of conductors 72 and 74.

When the range switch 50 is set to its various different positions, in order to achieve different scan times of the CRT beam from the tube centre to the tube periphery, the switches 52, 54 and 56 cause the deflection coils to be interconnected in different manners, and different combinations of the range inductor sections to be connected in series with them between +10 V and ground via circuit 44 in a manner which is best explained by means of the table below, while following the various conductor paths throughout FIGS. 1 and 2.

TABLE

| Range switch positon (miles) | Range inductor sections | Deflection coils | Scan time ($\mu s$) | Current drawn (amps) |
|---|---|---|---|---|
| 0.5 | none | 10,12 (parallel) | 6 | 18 |
| 1.0 | S | 10,12 (parallel) | 12 | 18 |
| 2.0 | S,T | 10,12 (series) | 24 | 8 |
| 4.0 | S,T,U | 10,12 (series) | 48 | 8 |
| 8.0 | S,T,U,V | 10,8,14,12 (series) | 96 | 3.3 |
| 16.0 | S,T,U,V,W | 10,8,14,12 (series) | 192 | 3.3 |

It will be noticed that the total inductance is stepped up from range to range by progressively including extra range inductor sections in series with each other. Additional progression of the inductance is achieved by having deflection coils 10 and 12 connected in parallel with each other for the two shortest ranges, thus making their combined inductance lower than that of either of them, connecting the same two deflection coils in series for the two middle ranges, thus increasing their combined inductance, and then further adding in series the deflection coils 8 and 14 for the two highest ranges. The deflection coils and the connections to them are so arranged that the currents flowing in them always produce mutually aiding magnetic fields.

It should be appreciated that when the number of effective coil turns is increased from 14 to 28 by switching in coils 8 and 14 for the two highest ranges, the current required to produce the desired strength of magnetic field is approximately halved, which results in a saving of power consumption.

In any deflection system any d.c. resistance possessed by the inductors or devices in series with them will create non linearity as the voltage across this resistance will increase with current thus tending to slow down the ramp disproportionately as it rises. By paralleling the scan coils on 0.5 and 1.0 mile ranges the resistance is reduced when the current is highest (say 18 A). By switching to series operation for 2.0 and 4.0 miles the current drops to about 8 A and finally to 3.5 A for the 8.0 and 16.0 mile ranges with extra active turns connected. This method of connection therefore optimises the balance of d.c. resistance and inductance for each range thus avoiding the necessity to provide a saturable reactor linearity corrector for each range.

I claim:

1. A cathode ray tube display device of the type in which a display is formed by repeated radially outward deflections of a beam at a constant speed, the deflections being successively angularly displaced relative to each other, the device having beam deflection coils and means for applying to inductive means which includes the beam deflection coils a voltage for causing a ramp current to flow in the coils to produce progressive beam deflection, comprising means for changing the scale of the display, said scale changing means being selectively operable by an operator to change the interconnections of the deflection coils included in the inductance presented to the voltage applying means and thereby change the gradient of the ramp current, whereby different constant radially outward speeds of beam deflection may be selected and thus the scale of the display may be set to different values.

2. A display device as claimed in claim 1, wherein said scale changing means is further adapted to selectively connect deflection coils in parallel or in series with each other to provide respectively lower and higher inductance values.

3. A cathode ray tube display device having beam deflection coils and means for applying to inductive means which includes the beam deflection coils a voltage for causing a ramp current to flow in the coils to produce progressive beam deflection, comprising means for changing the scale of the display, said scale changing means being operable to change the interconnections of the deflection coils included in the inductance presented to the voltage applying means and thereby change the gradient of the ramp current, the speed of beam deflection, and thus the scale of the display, wherein said scale changing means is further adapted to selectively connect deflection coils in parallel or in series with each other to provide respectively lower and higher inductance values, and wherein said scale changing means is adapted to connect one or more further deflection coils in series with said parallel and/or series connectable coils to effect said change in the interconnections of the deflection coils included in the inductance presented, whereby to provide one or more still higher inductance values.

4. A cathode ray tube display device having beam deflection coils and means for applying to inductive means which includes the beam deflection coils a voltage for causing a ramp current to flow in the coils to produce progressive beam deflection, comprising means for changing the scale of the display, said scale changing means being operable to change the interconnections of the deflection coils included in the inductance presented to the voltage applying means and thereby change the gradient of the ramp current, the speed of beam deflection, and thus the scale of the display, wherein said inductance means comprises one or more inductance values which is or are selectably connectable to the beam deflection coils to further change the inductance presented to the voltage applying means.

5. A display device as claimed in claim 4, wherein said scale changing means is operable simultaneously to change interconnections between the deflection coils and to connect or disconnect one or more of said one or more inductance values therewith.

6. A display device as claimed in claim 5, wherein said scale changing means is operable also to connect or disconnect one or more of said one or more inductance values with the deflection coils without changing the deflection coil interconnections.

7. A display device as claimed in claim 6, wherein said scale changing means is operable in successive steps to connect successively increasing inductance values with the deflection coils.

8. A display device as claimed in claim 7, wherein said scale changing means is operable in at least one of said steps to also change the deflection coil interconnections from parallel to series.

9. A display device as claimed in claim 7, wherein said scale changing means is operable in at least one of said steps to also connect an increased number of deflection coils in series with each other.

10. A display device as claimed in claim 1, wherein said scale changing means is settable to a minimum inductance setting at which said inductance presented to the voltage applying means is provided solely by the deflection coils.

11. A display device as claimed in claim 1, wherein said deflection coils are rotatable relative to the cathode ray tube to produce a progressively rotating display scan thereon.

12. A display device as claimed in claim 11, which is the display device of a radar equipment.

* * * * *